United States Patent
Floyd et al.

(10) Patent No.: US 9,800,278 B2
(45) Date of Patent: Oct. 24, 2017

(54) TUNABLE FILTERS, CANCELLERS, AND DUPLEXERS BASED ON PASSIVE MIXERS

(71) Applicant: North Carolina State University, Raleigh, NC (US)

(72) Inventors: Brian Allan Floyd, Raleigh, NC (US); Charley Theodore Wilson, III, Raleigh, NC (US); Jeffrey Franklin Bonner-Stewart, Raleigh, NC (US); Frederick Vosburgh, Durham, NC (US)

(73) Assignees: North Carolina State University, Raleigh, NC (US); Physical Devices, LLC, Durham, NC (US)

( * ) Notice: Subject to any disclaimer, the term of this patent is extended or adjusted under 35 U.S.C. 154(b) by 0 days.

(21) Appl. No.: 15/257,354

(22) Filed: Sep. 6, 2016

(65) Prior Publication Data
US 2017/0070251 A1  Mar. 9, 2017

Related U.S. Application Data

(60) Provisional application No. 62/214,876, filed on Sep. 4, 2015.

(51) Int. Cl.
| | |
|---|---|
| *H04B 1/44* | (2006.01) |
| *H04B 1/10* | (2006.01) |
| *H04L 7/00* | (2006.01) |

(52) U.S. Cl.
CPC ......... *H04B 1/1081* (2013.01); *H04B 1/1036* (2013.01); *H04L 7/0016* (2013.01)

(58) Field of Classification Search
CPC . H04B 1/48; H04B 1/44; H04B 1/525; H04B 1/18

USPC .................................................. 455/296, 78
See application file for complete search history.

(56) References Cited

U.S. PATENT DOCUMENTS

| | | | |
|---|---|---|---|
| 3,681,697 | A | 8/1972 | Moroney |
| 5,303,418 | A | 4/1994 | Staudinger et al. |
| 5,410,743 | A | 4/1995 | Seely et al. |
| 5,512,963 | A | 4/1996 | Mankovitz |
| 5,564,086 | A * | 10/1996 | Cygan ................. H04B 1/0458 333/17.3 |
| 6,020,783 | A | 2/2000 | Coppola |
| 6,029,059 | A | 2/2000 | Bojer |
| (Continued) | | | |

OTHER PUBLICATIONS

Non-Final Office Action for U.S. Appl. No. 14/677,928 (Aug. 25, 2016).

(Continued)

*Primary Examiner* — Sonny Trinh
(74) *Attorney, Agent, or Firm* — Jenkins, Wilson, Taylor & Hunt, P.A.

(57) ABSTRACT

Tunable filters, cancellers, and duplexers based on passive mixers. A tunable delay cell includes passive mixers electrically coupled together for receiving an input signal and outputting a delayed signal, each passive mixer comprising a plurality of mixer switches. The tunable delay includes a control circuit for providing, to each passive mixer, a respective plurality of local oscillator (LO) signals, one to each mixer switch of each passive mixer. The control circuit is configured to vary the LO signals to cause a target frequency band of the input signal to be delayed by a target delay time in propagating through the passive mixers.

8 Claims, 12 Drawing Sheets

(56) References Cited

U.S. PATENT DOCUMENTS

| | | | |
|---|---|---|---|
| 6,107,898 A | 8/2000 | Rauscher | |
| 6,343,211 B1 | 1/2002 | Thodesen et al. | |
| 6,714,775 B1 | 3/2004 | Miller | |
| 6,745,019 B1 | 6/2004 | Thodesen | |
| 6,792,250 B1 | 9/2004 | Zarubin | |
| 6,917,815 B2 | 7/2005 | Hajimiri et al. | |
| 6,934,341 B2 | 8/2005 | Sahlman | |
| 7,085,122 B2 | 8/2006 | Wu et al. | |
| 7,145,415 B2 | 12/2006 | Sengupta et al. | |
| 7,345,557 B2 | 3/2008 | Podell | |
| 7,545,622 B2 | 6/2009 | Morris, III et al. | |
| 7,561,009 B2 | 7/2009 | Larson, III et al. | |
| 7,584,496 B2 | 9/2009 | Zinevitch | |
| 7,692,513 B2 | 4/2010 | Yoshimoto | |
| 7,768,364 B2 | 8/2010 | Hart et al. | |
| 8,285,217 B1 * | 10/2012 | Rockway | H04B 1/525 455/278.1 |
| 8,314,653 B1 | 11/2012 | Granger-Jones et al. | |
| 8,320,842 B2 * | 11/2012 | Rousu | H04B 1/0057 455/78 |
| 8,351,889 B2 | 1/2013 | Roussel et al. | |
| 8,565,681 B2 | 10/2013 | Kim et al. | |
| 8,666,347 B2 | 3/2014 | Wilkerson et al. | |
| 9,020,065 B2 | 4/2015 | Wyville | |
| 9,042,847 B2 | 5/2015 | Zhou | |
| 9,071,337 B2 * | 6/2015 | Hellsten | G01S 7/006 |
| 9,083,518 B2 | 7/2015 | Bauder et al. | |
| 9,088,344 B2 | 7/2015 | Wyville | |
| 2006/0009172 A1 | 1/2006 | Shamsaifar | |
| 2010/0148888 A1 | 6/2010 | Hara et al. | |
| 2011/0065408 A1 | 3/2011 | Kenington et al. | |
| 2011/0122932 A1 | 5/2011 | Lovberg et al. | |
| 2011/0227665 A1 | 9/2011 | Wyville | |
| 2012/0128350 A1 | 5/2012 | Popovic | |
| 2014/0204808 A1 | 7/2014 | Choi et al. | |
| 2014/0273814 A1 | 9/2014 | Ralph et al. | |
| 2014/0323076 A1 | 10/2014 | Kintis et al. | |
| 2014/0376419 A1 | 12/2014 | Goel et al. | |
| 2015/0078702 A1 | 3/2015 | Dorin et al. | |
| 2015/0094008 A1 | 4/2015 | Maxim et al. | |
| 2015/0099478 A1 | 4/2015 | Wyville | |
| 2015/0133068 A1 | 5/2015 | Aggarwal et al. | |
| 2015/0155899 A1 | 6/2015 | Webb et al. | |
| 2015/0194884 A1 | 7/2015 | Levesque et al. | |
| 2015/0208137 A1 | 7/2015 | Alrutz | |
| 2015/0263782 A1 | 9/2015 | Wyville et al. | |
| 2015/0288392 A1 | 10/2015 | Floyd et al. | |

OTHER PUBLICATIONS

Notice of Allowance and Fee(s) Due for U.S. Appl. No. 14/677,938 (May 11, 2016).
Non-Final Office Action for U.S. Appl. No. 14/677,938 (Nov. 5, 2015).
Mirzaei et al., "Architectural evolution of integrated M-phase high-Q bandpass filters," IEEE Trans. Circuits and Systems—I, vol. 59, No. 1, pp. 52-65 (Jan. 2012).
Bolton, "Abstract: Mobile Device RF Front-End TAM analysis and forecast". CS ManTech Conference, p. 1 (May 16, 2011).
Mirzaei et al., "Analysis of imperfections on performance of 4-phase passive-mixer-based high-Q bandpass filters in SAW-less receivers," IEEE Trans. Circuits and Systems—I, vol. 58, No. 5, pp. 879-892 (May 2011).
Ghaffari et al., "Tunable high-Q N-path band-pass filters: modeling and verification," IEEE J. Solid-State Circuits, vol. 46, No. 5, pp. 998-1010 (May 2011).
Sideco, "Smartphones to account for majority of cellphone shipments in 2015" IHS iSupply report, pp. 2-1 (2011).
Natarajan et al., "A fully-integrated 16-element phased-array receiver in SiGe BiCMOS for 60-GHz communications," IEEE J. Solid-State Circuits, vol. 46, No. 5, pp. 1059-1075 (May 2011).
Gartner, "Smartphone shipments up 42 per cent in Q3 2011," www.gartner.com, pp. 1-4 (Nov. 16, 2011).
Andrews et al., "Implications of passive mixer transparency for impedance matching and noise figure in passive mixer-first receivers," IEEE Trans. Circuits and Systems—I, vol. 57, No. 12, pp. 3092-3103 (Dec. 2010).
Vye, "Perspectives on Mobile Device Front-end integration," MW Jour, pp. 1-11 (Sep. 15, 2010).
Werth et al., "System design considerations for SAW-less front-ends at the example of GSM DCS1088" 53rd MidWest Symp Circ and Sys, pp. 648-651 (2010).
"RF Device Module for Cellular," Navian Inc., www.navian.co.jp, slides 1-12, (2009).
Meeker et al., "Internet Trends" Ten Questions Intetnet Execs Should Ask & Answer, Morgan Stanley Investor Conference, NY, siles 1-49, (Apr. 2010).
Mi et al., "MEMS tunable bandpass filter on high-k LTCC" 23rd Int. Conf MEMS, pp. 787-790 (2010).
Hu et al., "A wide-tuning digitally controlled FBAR-based oscillator for frequency synthesis." Int Freq Cont Symp (FCS) pp. 608-612 (2010).
Abouzied et al., "An integrated SAW-less narrowband RF front-end," 53rd Midwest Symp Cir and Sys, pp. 664-667 (2010).
Tsai et al., "60GHz passive and active RF-path phase shifters in silicon," IEEE RFIC Symp. Dig. Papers, pp. 223-226 (Jun. 2009).
Reines et al., "Cascadable RF MEMS switched capacitors for 0.1 to 2 GHz applications" Microwave Symp Digest, pp. 1157-1160 (2009).
Hilbert "Radio Frequency MEMS for Wireless Communications," IEEE Magazine, pp. 68-74 (Aug. 2008).
Floyd et al., "A 16 to 18.8-GHz sub-integer-N frequency synthesizer for 60-GHz transceivers," IEEE J. Solid-State Circuits, vol. 43, No. 5, pp. 1076-1086 (May 2008).
Darabi, "A blocker filter technique for SAW-less wireless receivers" IEEE Solid State Circuits (42), pp. 2766-2773 (2007).
Long, "Monolithic transformers for silicon RF IC design," IEEE J. Solid-State Circuits, vol. 35, No. 9, pp. 1368-1382 (Sep. 2000).
Franks et al., "An alternative approach to the realizations of network functions: The N-path filter," Bell Syst. Tech. J., pp. 1321-1350 (1960).
Cross, "MEMS for secure RFID" Crebrex Technologies SBIR Phase II report. FCC11, pp. 1-2 (Retrieved from htlps:/lwww.sbir.gov/sbirsearch/delaiU121049 on Oct. 30, 2015).
Angier, "Tunable RF Filters: Pursuing the 'holy grail' of acoustic filter R&D." http://mwjournal/expertadvice/tunable_RF_fulters_pursuing_holy_grail_acoustic_filter_/RES_125/, pp. 1-2 (Jun. 16, 2008).
Kaskowitz, "Mobile Everywhere—how enriched mobile media is changing the IP landscape" http://www.design-reuse.com/webinar/intro/ infinitedge2, slides 1-22 (2010).
"RF Filters, PAs, Antenna Switches & Tunability for Cellular Handsets," Yole Développement, pp. 1-16 (2012).
Mi et al., "MEMS Tunable Bandpass Filters on High-k LTCC," IEEE, pp. 787-790 (Copyright 2010).
Doherty et al., "A New High Efficiency Power Amplifier for Modulated Waves," Proceedings of the Institute of Radio Engineers, vol. 24, No. 9, pp. 1-20 (Sep. 1936).
Natarajan et al., "A Bidirectional RF-Combining 60GHz Phased-Array Front End," 2007 IEEE International Solid-State Circuits Conference, pp. 202-203, 597 (2007).
Notice of Allowance and Fee(s) Due for U.S. Appl. No. 14/677,938 (Jan. 10, 2017).

* cited by examiner

TUNABLE FILTERS, CANCELLERS, AND DUPLEXERS BASED ON PASSIVE MIXERS

PRIORITY CLAIM

This application claims the benefit of U.S. Provisional Application Ser. No. 62/214,876, filed Sep. 4, 2015, the disclosure of which is incorporated herein by reference in its entirety.

GOVERNMENT INTEREST

This invention was made with government support under grant number 1353180 awarded by the National Science Foundation. The government has certain rights to this invention.

TECHNICAL FIELD

The subject matter described herein relates to methods and electronic devices, e.g., tunable filters, cancellers, and duplexers based on passive mixers.

BACKGROUND

With increasing smartphone sales and consumption of bandwidth, wireless providers and device manufacturers are being pressured to improve spectral efficiency. Multi-band smartphones can use multiple channel filters to effectively use the wireless spectrum. The prospect of ever rising cost, complexity and space requirements in smartphones has driven the search for an ultra-wideband tunable filter. To date, research has focused on microelectromechanical systems (MEMS) or other switched filter banks and on tunable capacitors, but these solutions have not yet met all the criteria for commercial success. Without a cost-effective ultra-wideband tuning technology free of distortion, utilization of spectrum will be inadequate, adversely affecting consumers, industry and the economy.

Accordingly, there exists a need for a cost-effective ultra-wideband tuning technology with low distortion, and particularly for tunable filters, cancellers, and duplexers.

SUMMARY

The subject matter described herein includes tunable filters, cancellers, and duplexers based on passive mixers. A tunable delay cell includes passive mixers electrically coupled together for receiving an input signal and outputting a delayed signal, each passive mixer comprising a plurality of mixer switches. The tunable delay includes a control circuit for providing, to each passive mixer, a respective plurality of local oscillator (LO) signals, one to each mixer switch of each passive mixer. The control circuit is configured to vary the LO signals to cause a target frequency band of the input signal to be delayed by a target delay time in propagating through the passive mixers.

A tunable filter includes a reflective-type filter that includes a filter input for receiving an input signal, a filter output for outputting a filtered signal, and first and second reflective loads. The reflective-type filter includes a directional coupler for coupling the input signal to the first and second reflective loads and for coupling first and second reflected signals from the first and second reflective loads to the filter output. The first and second reflective loads are configured so that the combination of the first and second reflected signals results in a filtered response of the filter input at the filter output. Example filtered responses include bandpass or bandstop. The tunable filter includes a feedforward path, between the filter input and the first and second reflective loads, configured to cancel isolation leakage within the reflective-type filter.

A tunable duplexer includes one or more antennas; an isolator electrically coupled to the one or more antennas for isolating a received signal and a transmitted signal on the one or more antennas; a combiner comprising a first input electrically coupled to the one or more antennas; and a feedforward path, between a coupler of the transmitted signal and a second input of the combiner, configured to cancel leakage across the isolator. The feedforward path comprises a tunable delay cell including a plurality of passive mixers electrically coupled together for receiving an input signal and outputting a delayed signal, each passive mixer including a plurality of mixer switches.

A tunable duplexer includes one or more antennas; an isolator electrically coupled to the one or more antennas for isolating a received signal and a transmitted signal on the one or more antennas; a combiner comprising a first input electrically coupled to the one or more antennas; a reflective-type tunable filter electrically coupled to an output of the combiner; and a feedforward path, between the output of the combiner and one or more reflective loads of the reflective-type tunable filter, configured to cancel leakage across the a directional coupler of the reflective-type tunable filter.

A tunable duplexer includes one or more antennas; an isolator electrically coupled to the one or more antennas for isolating a received signal and a transmitted signal on the one or more antennas; a combiner comprising a first input electrically coupled to the one or more antennas; a reflective-type tunable filter electrically coupled to an output of the combiner; and a feedforward path, between a coupler of the transmitted signal and one or more reflective loads of the reflective-type tunable filter, configured to cancel leakage across the isolator.

The subject matter described herein may be implemented in hardware, software, firmware, or any combination thereof. As such, the terms "function" "node" or "module" as used herein refer to hardware, which may also include software and/or firmware components, for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

DETAILED DESCRIPTION

This specification describes technology that can be used to implement a tunable channel selection filter for smartphones and other wireless mobile devices and radios. The technology can use frequency-translating passive mixers with feedforward cancellation to realize a widely tunable filter which reduces the need for resonance-based filters in common use today. The filter can be implemented, e.g., as a complementary metal-oxide semiconductor (CMOS) circuit to provide the low size, weight, power and cost required of consumer wireless electronics, while also addressing military requirements for multi-band tuning.

Figure 1:
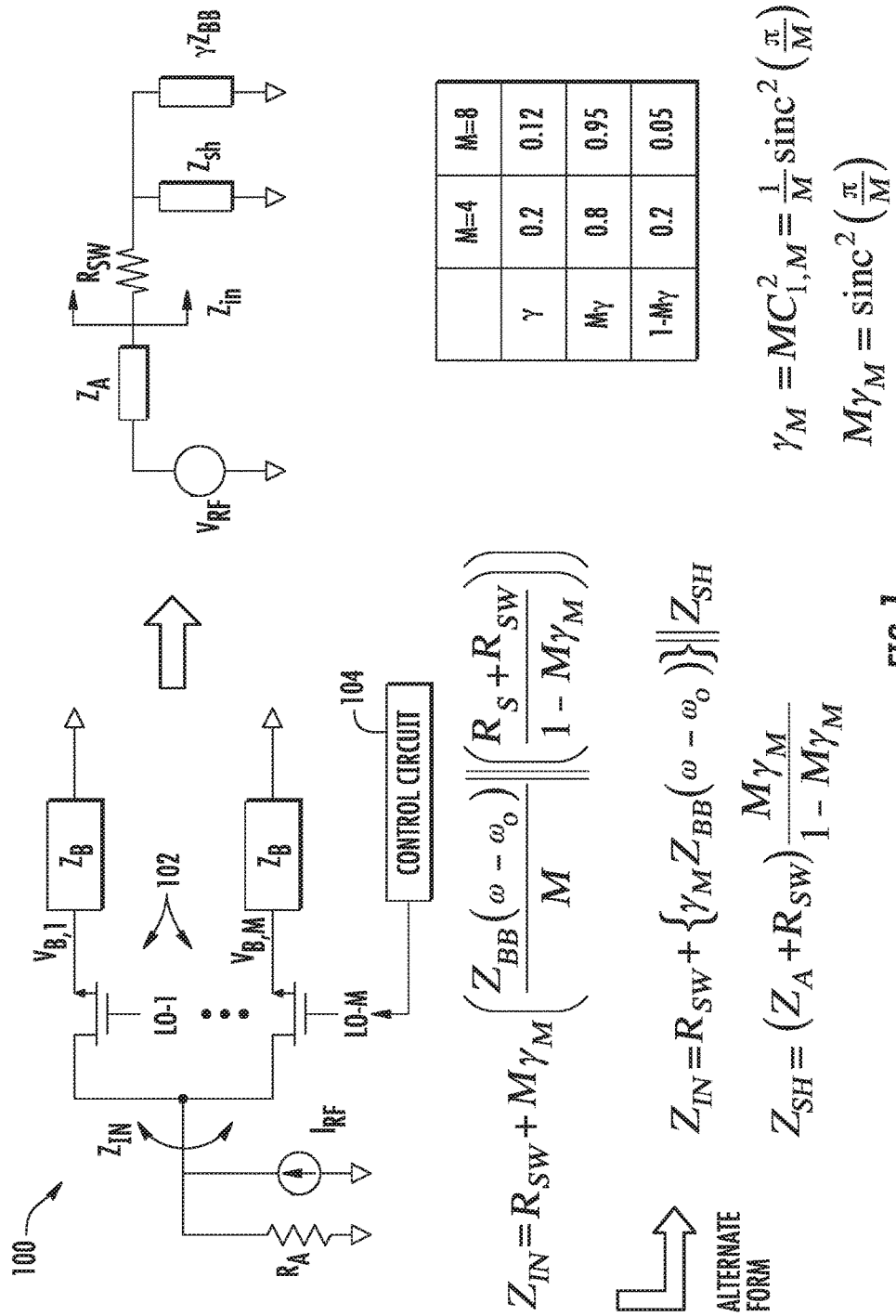
FIG. 1 is a diagram illustrating a passive mixer that includes a number of mixer switches and a control circuit.

FIG. 1 is a diagram illustrating a passive mixer 100 that includes a number of mixer switches 102 and a control circuit 104. The passive mixer 100 can be used in various implementations of delay cells, tuners, and duplexers, e.g., as described further below with reference to the remaining figures.

The mixer switches 102 can be implemented using CMOS transistors or any appropriate switching technology. The control circuit 104 can be implemented using any appropriate combination of hardware, firmware, and/or software. The control circuit 104 can include a local oscillator and any appropriate circuitry for generating and phase-shifting local oscillator signals. In some examples, the control circuit 104 is implemented using one or more processors configured to execute instructions stored on a non-transitory computer readable medium.

In operation, the control circuit 104 provides M local oscillator (LO) signals (LO-1 to LO-M) to the mixer switches 102. The LO signals can be signals at a same frequency that are phase-shifted from one another. The LO signals can also be non-overlapping, such that when used to control the mixer switches, only one mixer switch is turned on at a time. The control circuit 104 can be configured to adjust the LO signals to cause the passive mixer 100 to operate as a frequency-shifting mixer. For example, the passive mixer 100 can operate as a down-shifting mixer that inputs a radio frequency (RF) input signal and outputs a baseband signal or an up-shifting mixer that inputs a baseband signal and outputs an RF output signal.

In the illustrated example:
Baseband impedance is frequency translated to the LO band (and harmonics).
Low-pass $Z_{BB}$ becomes bandpass $Z_{in}$
High-pass $Z_{BB}$ becomes bandstop $Z_{in}$
$R_{sw}$ is the nonzero "on-resistance" of the mixer switches.
$Z_{sh}$ represents the power loss through re-radiation to harmonics (only at odd harmonics for fully-differential)

Figure 2A:
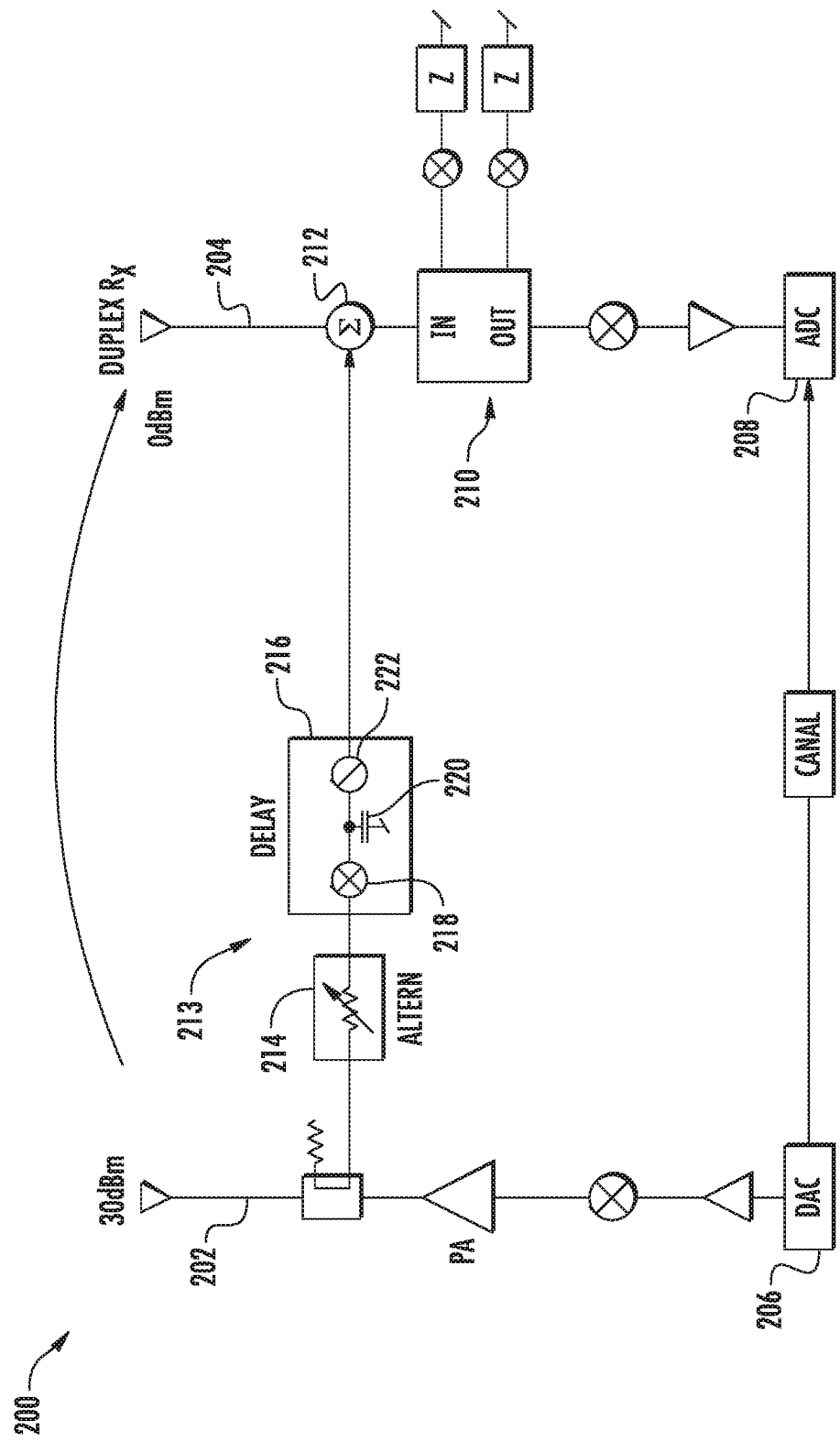
FIG. 2A is a block diagram of an example duplexer.

FIG. 2A is a block diagram of an example duplexer 200. The duplexer 200 includes a transmit antenna 202 and a receive antenna 204. The duplexer 200 includes a transmit channel including a digital-to-analog converter (DAC) 206 and a receive channel including an analog-to-digital converter (ADC) 208. The receive channel includes a tunable reflective-type filter 210 for tuning to a particular frequency band of the received signal.

Figure 2B:
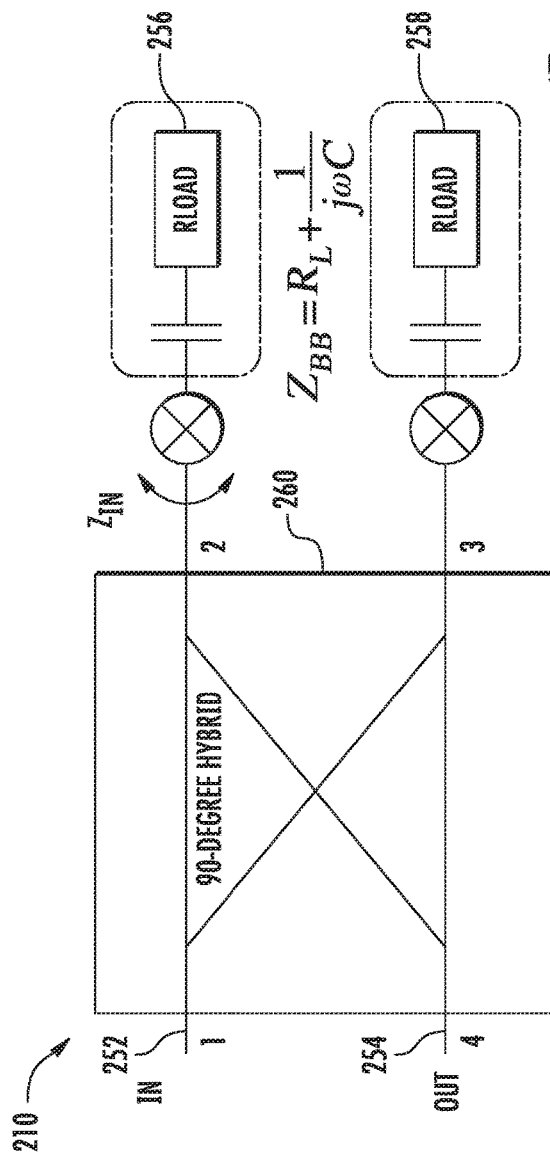
FIG. 2B is a block diagram of an example tunable reflective-type filter.

The tunable reflective-type filter 210 (as illustrated in FIG. 2B) includes a filter input 252 for receiving an input signal, a filter output 254 for outputting a filtered signal, and first and second reflective loads 256 and 258. The tunable reflective-type filter 210 includes a directional coupler 260 (e.g., a 90-degree hybrid coupler) for coupling the input signal to the first and second reflective loads and for coupling first and second reflected signals from the first and second reflective loads to the filter output. The first and second reflective loads 256 and 258 are configured, e.g., by appropriate selection of resistance and capacitance, so that the combination of the first and second reflected signals results in a bandpass response of the filter input 252 at the filter output 254.

In operation, the transmitted signal on the transmit antenna 202 is received, at least in part, on the receive antenna 204, i.e., there will be some leakage from the transmit antenna 202 to the receive antenna 204. The duplexer 200 can cancel some or all of the leakage using a feedforward path 213 coupled from the transmit channel to a combiner 212. The feedforward path 213 includes an adjustable attenuator 214 and a tunable delay cell 216. The tunable delay cell 216 includes a down-shifting mixer 218, a bandpass filter 220 (e.g., a capacitor), and a down-shifting mixer 222 electrically coupled together for receiving an input signal and outputting a delayed signal.

FIG. 2B is a block diagram of an example tunable reflective-type filter 210. The out-of-band response of the tunable reflective-type filter 210 can theoretically be very low, as the circuit looks like an absorber out of band. Additionally, the tunable reflective-type filter 210 can work with very small low capacitance switches, so that the power consumption of the passive mixers can be reduced significantly. The equations illustrated in FIG. 2B are approximations. In the illustrated example:
Out-of-band, the values of $R_{sw}$, RL and $R_{shunt}$ chosen to achieve a matched condition.
In-band, there is a relatively large impedance. The goal is to make this impedance large with respect to $R_O$.

Figure 3:
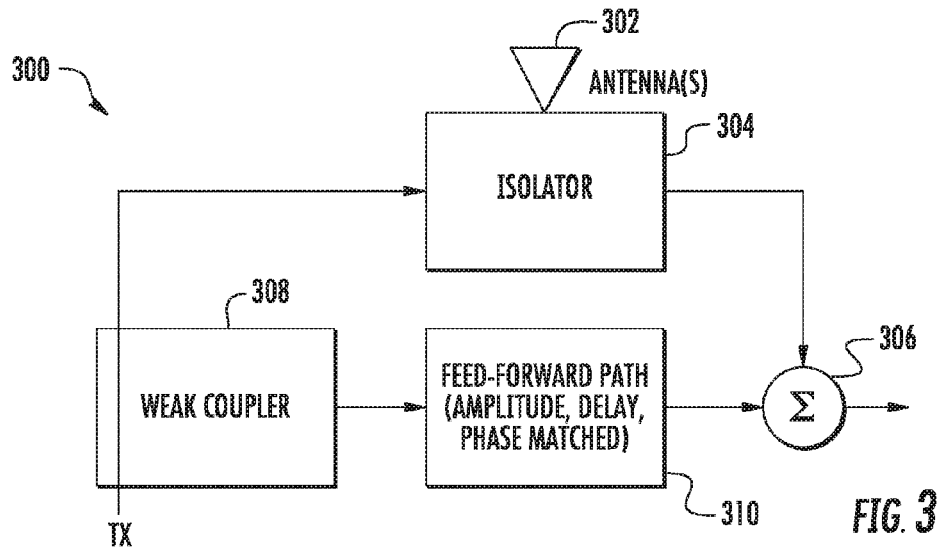
FIG. 3 is a block diagram of an example duplexer.

FIG. 3 is a block diagram of an example duplexer 300. The duplexer includes one or more antennas 302 and an isolator 304 for isolating a received signal and a transmitted signal for the antennas 302. For example, the duplexer 300 can implement the antennas 302 and isolator 304 using two antennas and a circulator.

The duplexer 300 includes a combiner 306 having an input coupled to the isolator 304 and another input coupled to a feedforward path 310 of a coupler 308 of the transmitted signal, e.g., a weak coupler. The feedforward path 310 includes circuits to alter the amplitude, delay, and phase of the transmitted signal through the coupler 308 so that the combiner 306 can removes whatever portion of the transmitted signal leaks across the isolator 304. In essence, the feedforward path 310 is configured, by virtue of appropriate selection of amplitude, delay and phase matching, to match or approximate the path of the transmitted signal across the isolator 304, so that when the feedforward signal is subtracted from the received signal, only the received signal remains. The feedforward path 310 can also be configured to cancel out-of-band noise, e.g., by coupling to a tunable filter.

Figure 4A:
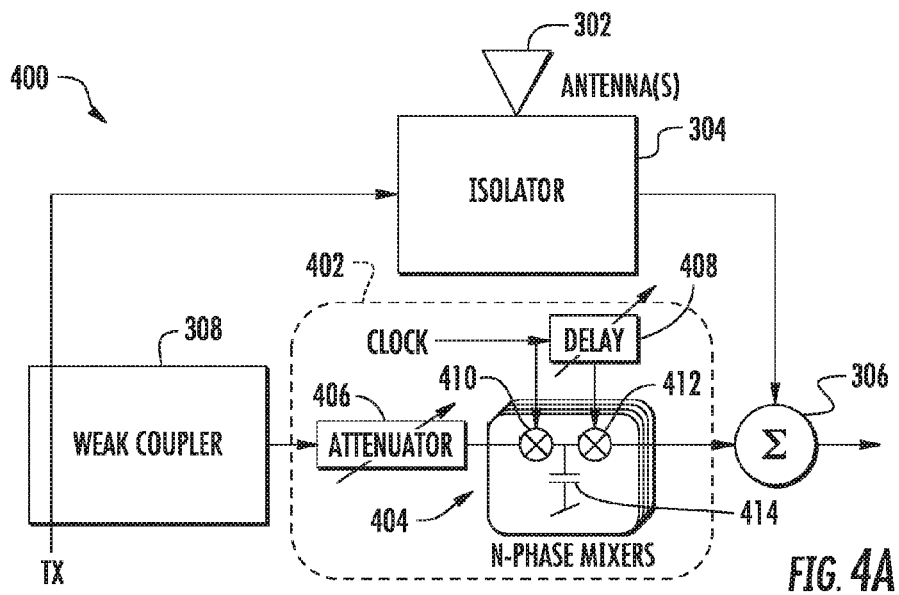
FIG. 4A is a block diagram of an example duplexer implemented using a tunable delay cell.

FIG. 4A is a block diagram of an example duplexer 400 implemented using a tunable delay cell 402. The tunable delay cell includes a number of passive mixers 404, an adjustable attenuator 406, and a delay circuit 408. The number of passive mixers comprises an N-phase passive mixer. The passive mixers 404 include a down-shifting mixer 410, a baseband filter 414, and an up-shifting mixer 412. The baseband filter 414 can be, e.g., one or more capacitors.

The loss can be set by the adjustable attenuator 406. The passive mixers 404 realize a tunable delay cell. The coarse delay of the tunable delay cell can be set, e.g., by a control circuit, by reordering the phases of the LO signals supplied to the passive mixers 404. The fine delay of the tunable delay cell can be set, e.g., by a control circuit, by offsetting the clocks between two passive mixers within a least significant bit (LSB) of a variable representing the delay of the cell as a mixer period. In some examples, the control circuit includes the delay circuit 408 which is configured to vary LO signals by offsetting respective clock signals. In operation, the tunable delay cell 402 behaves like a delay line within the passband of the baseband filter 404.

Figure 4B:
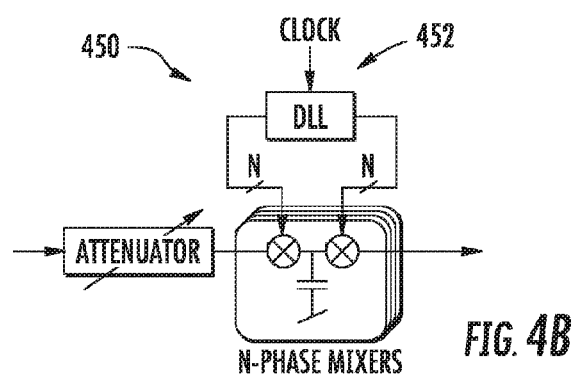
FIG. 4B is a diagram of a different example of a tunable delay cell.

FIG. 4B is a diagram of a different example of a tunable delay cell 450. The tunable delay cell 450 realizes control of the target delay time using a delay-locked loop (DLL) 452.

Figure 5:
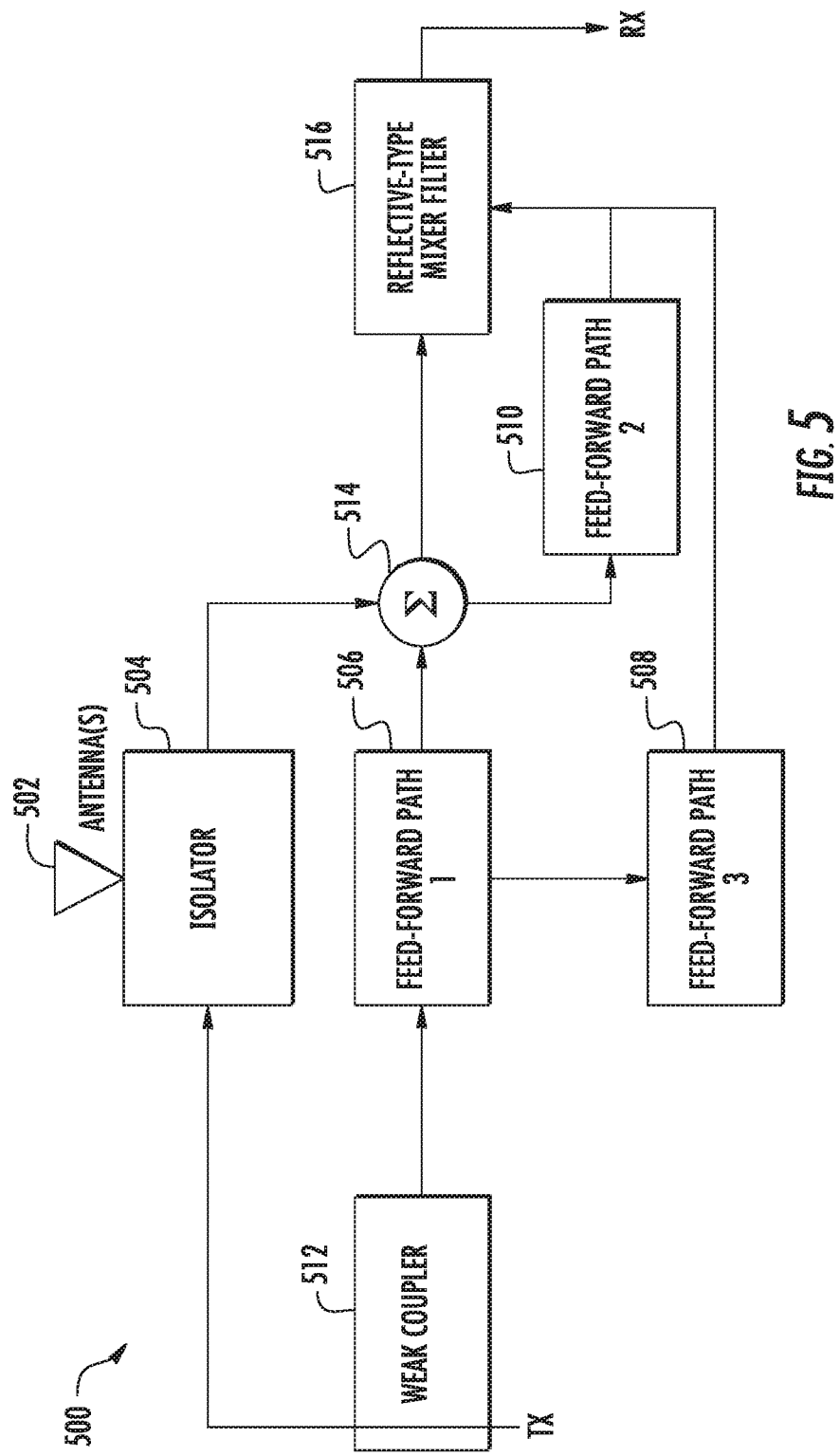
FIG. 5 is a block diagram of an example duplexer having three feedforward paths.

FIG. 5 is a block diagram of an example duplexer 500 having one or more antennas 502, an isolator 504 electrically coupled to the one or more antennas 502 for isolating a received signal and a transmitted signal on the one or more antennas 502, and three feedforward paths 506, 508, and 510. The feedforward paths 506, 508, and 510 can be implemented using tunable delay cells implemented by passive mixers.

The first feedforward path 506 starts at a weak coupler 512 to the transmitter and ends at an adder 514. The adder 514 is a circuit configured to add the signal at the output of the first feedforward path 506 with the received output signal of the isolator 504. The output of the adder 514 is coupled to a reflective-type mixer filter 516, and the output of the reflective-type mixer filter 516 is coupled to the receiver.

The second feedforward path 508 branches from the first feedforward path 506 (or from the weak coupler 512 if the first feedforward path 506 is absent) to the reflective-type mixer filter 516. The third feedforward path 510 starts at the output of the adder 514 and ends at the reflective-type mixer filter 516.

Each of the feedforward paths 506, 508, and 510 can be implemented independently of the other feedforward paths so that the duplexer 500 can be implemented having any combination of the feedforward paths 506, 508, and 510. For example, FIG. 6 shows an example duplexer 600 using the first feedforward path 504, FIG. 7 shows an example duplexer 700 using the first and third feedforward paths 504 and 508, and FIG. 8 shows an example duplexer 800 using the first, second, and third feedforward paths 504, 506, and 508.

Figure 6:
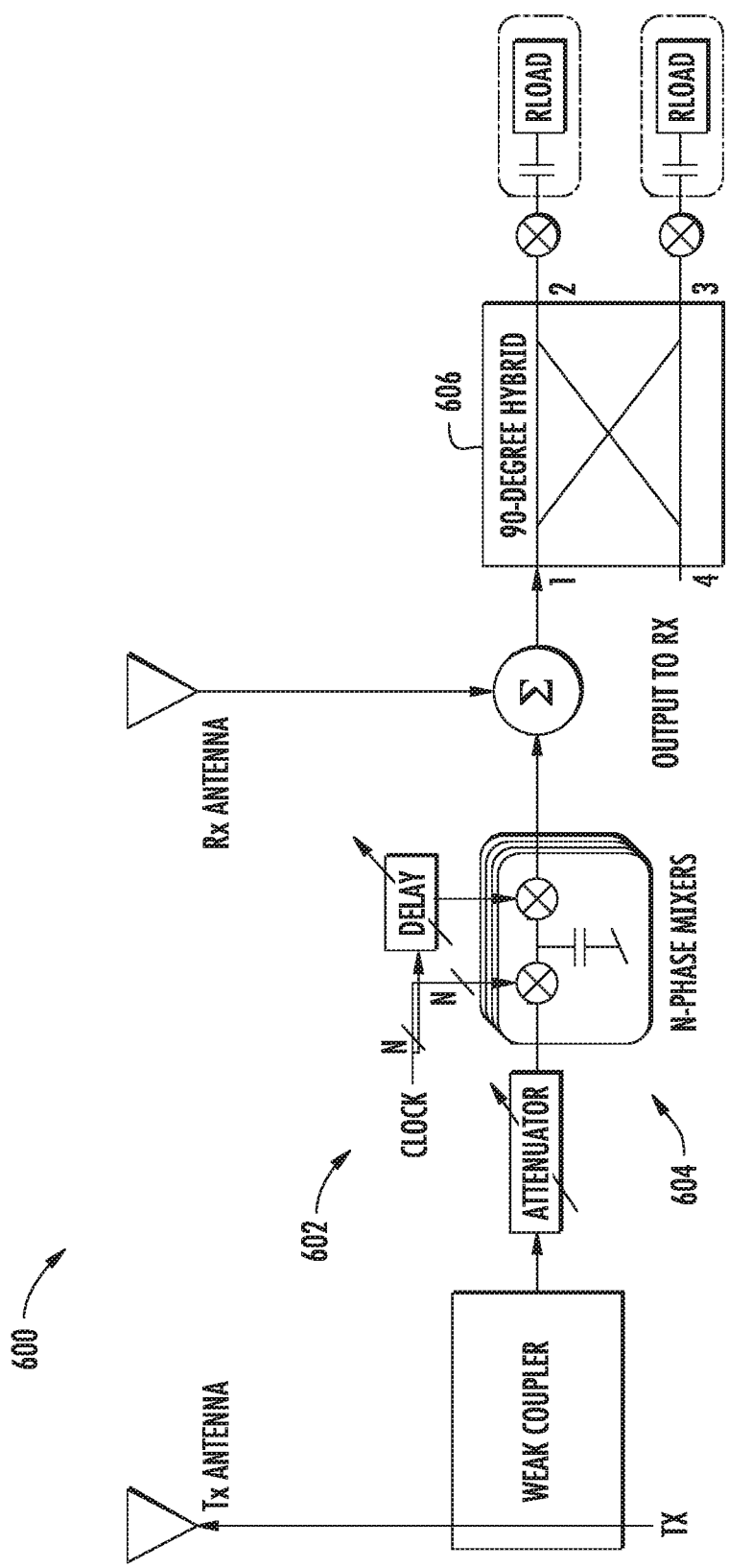
FIG. 6 is a block diagram of an example duplexer having one feedforward path that cancels leakage across the isolation between two antennas.

FIG. 6 is a block diagram of an example duplexer 600 having one feedforward path 602 that cancels leakage across the isolation between two antennas. The feedforward path 602 can be configured, e.g., by tuning a tunable delay cell 604 in the feedforward path 602, to pre-distort to cancel leakage across the coupler 606 of a reflective-type tunable filter.

Figure 7:
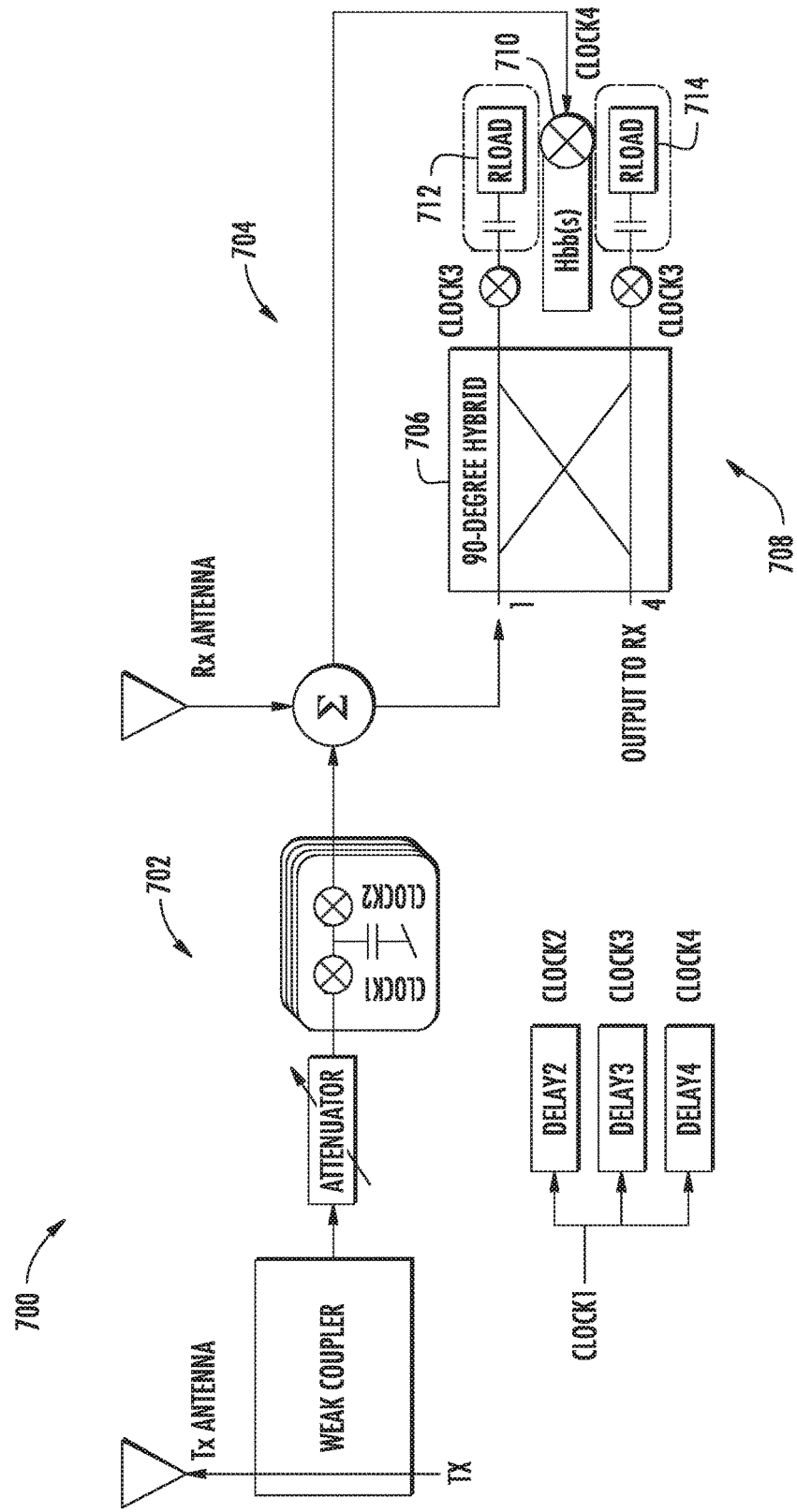
FIG. 7 is a block diagram of an example duplexer having two feedforward paths.
Figure 8:
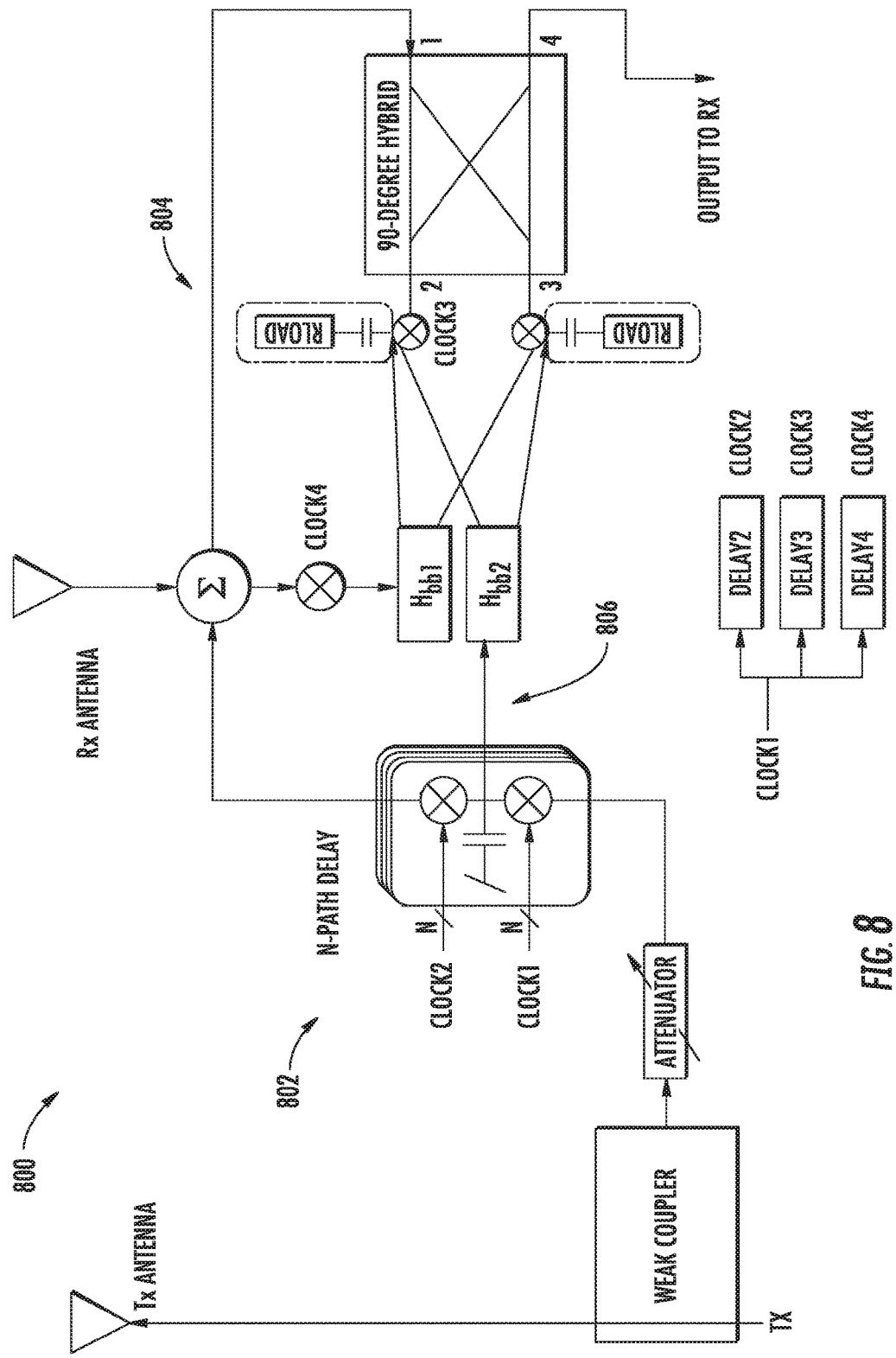
FIG. 8 is a block diagram of an example duplexer having three feedforward paths.

FIG. 7 is a block diagram of an example duplexer 700 having two feedforward paths. A first feedforward path 702 cancels the leakage across the isolator between the two antennas. A second feedforward path 704 cancels the leakage across the coupler 706 of the reflective-type tunable filter 708. The duplexer 700 uses a clock and three different delayed clocks to tune the tunable delay cells of the two feedforward paths. Clock4 can be its own delayed clock, i.e., a delayed version of clock1 with a delay value different from clocks 2 and 3, or clock4 can come from one of the other available clocks.

The second feedforward path 704 is configured to cancel the leakage over the coupler by virtue of a down-converting mixer 710 configured to downconvert a feedforward signal on the second feedforward path 704 to baseband before the feedforward signal is coupled to one or more reflective loads 712 and 714 of the reflective-type tunable filter 708. The down-converting mixer 710 is configured to downconvert the feedforward signal by virtue of being supplied with an appropriate control signal, e.g., clock4.

FIG. 8 is a block diagram of an example duplexer 800 having three feedforward paths 802, 804, 806. The third feedforward path 806 can be used, e.g., instead of or in addition to the first feedforward path 802 to cancel leakage across the isolator between the two antennas. The duplexer 800 uses a clock and three different delayed clocks to tune the tunable delay cells of the two feedforward paths, e.g., as described above with reference to FIG. 7.

Figure 9:
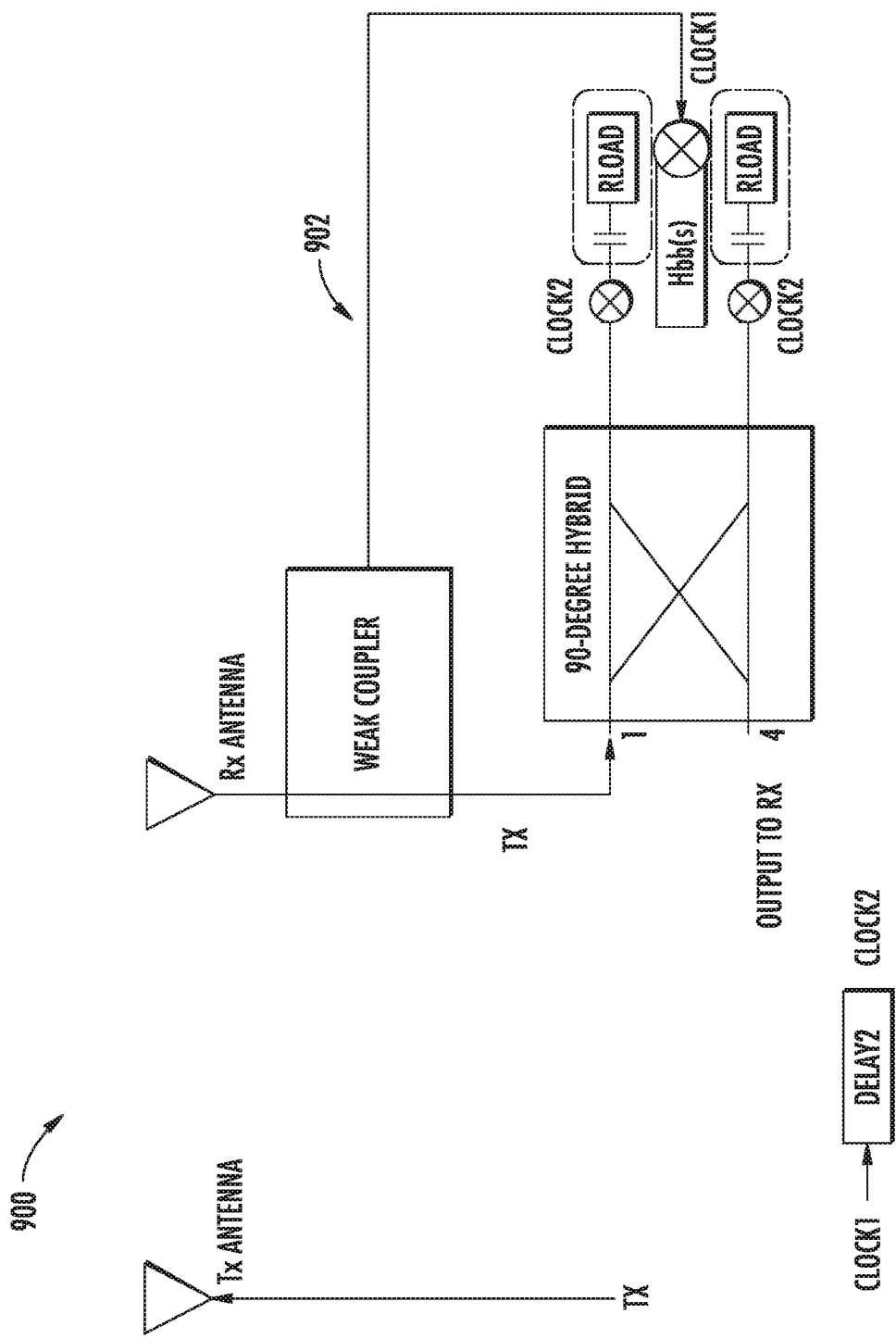
FIG. 9 is a block diagram of an example duplexer having one feedforward path to cancel leakage across the coupler of the reflective-type tunable filter.
Figure 10:
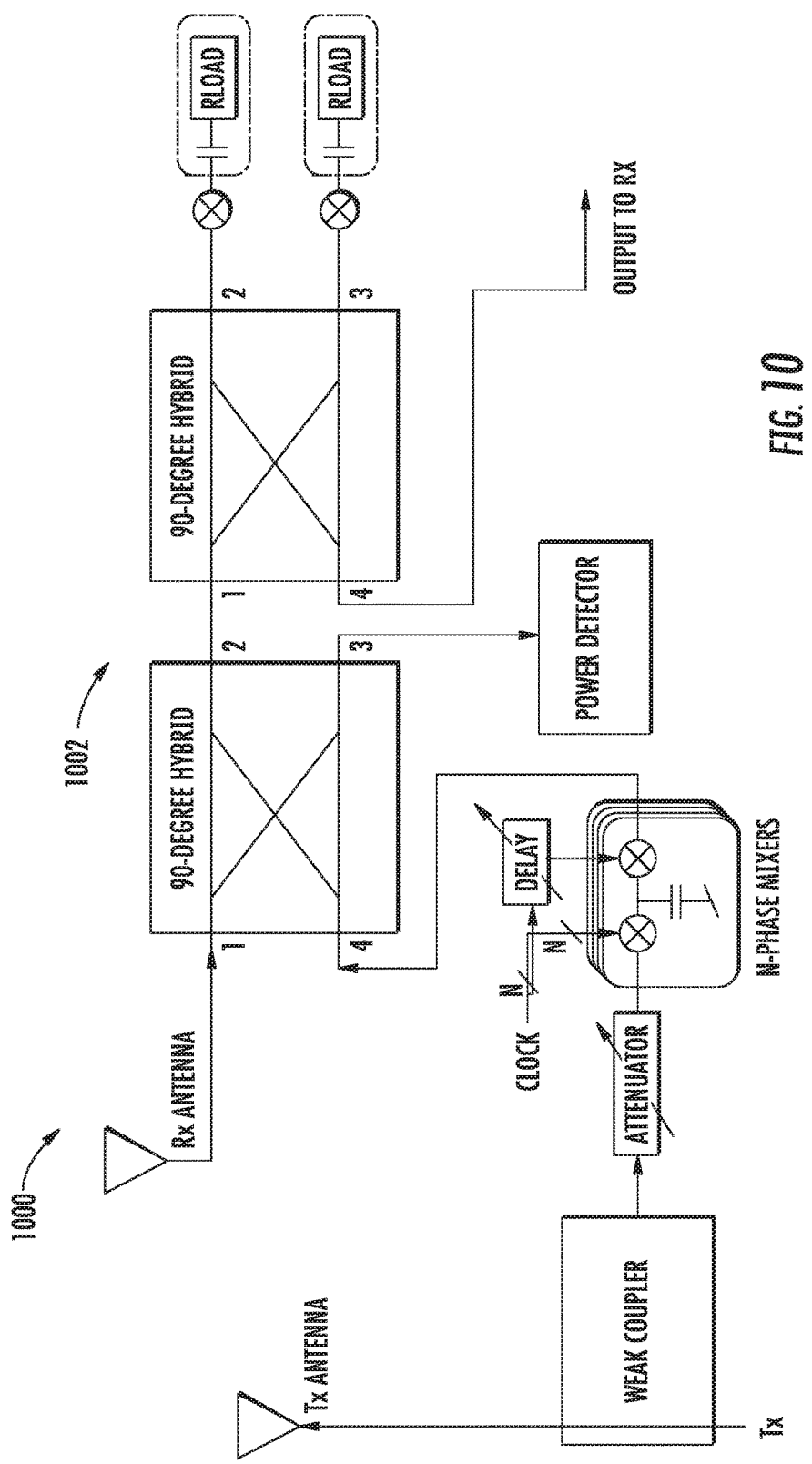
FIG. 10 is a block diagram of an example duplexer having a Marchand balun implemented using passive mixers.
Figure 11:
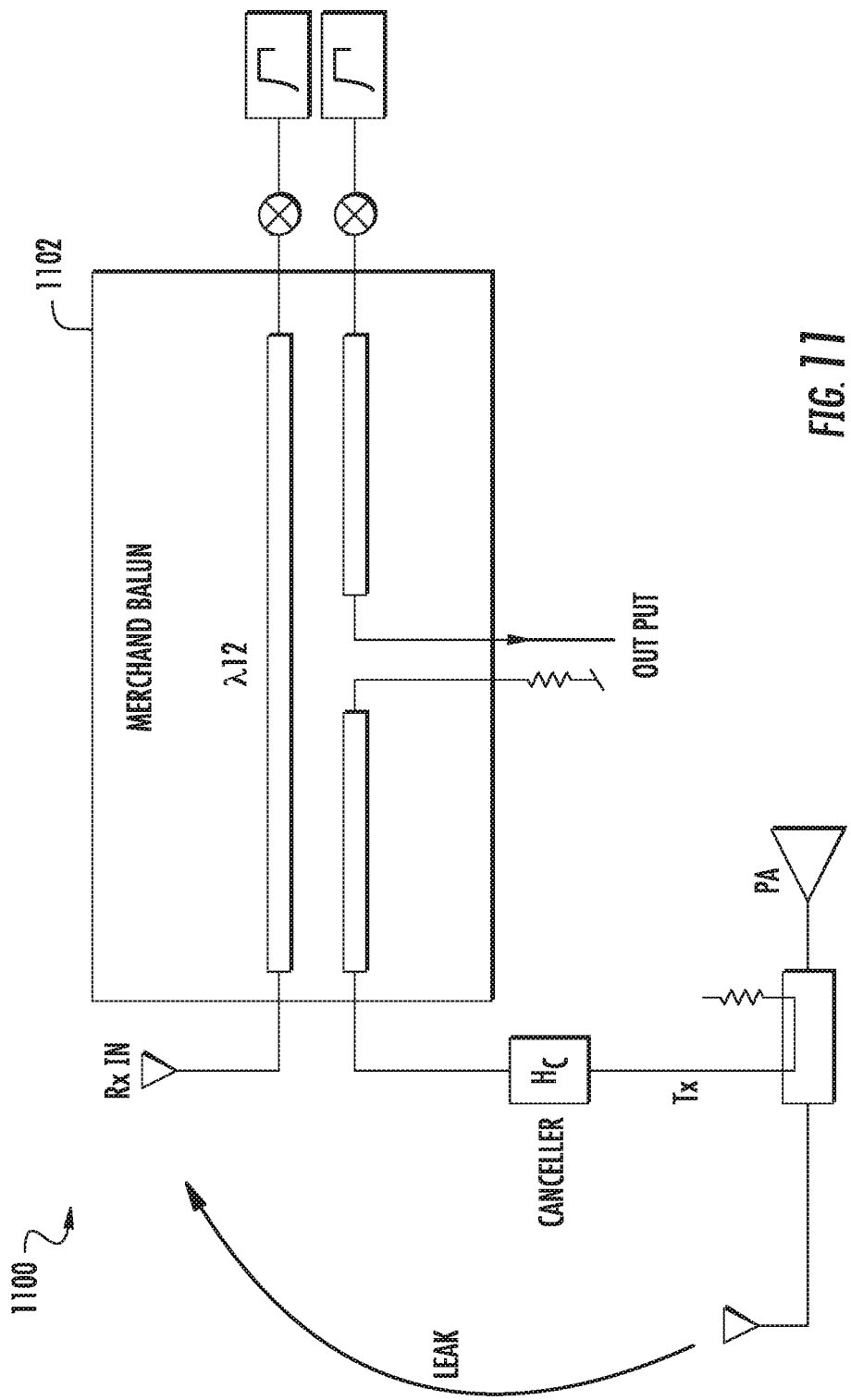
FIG. 11 is a block diagram of an example duplexer having a Marchand balun.
Figure 12:
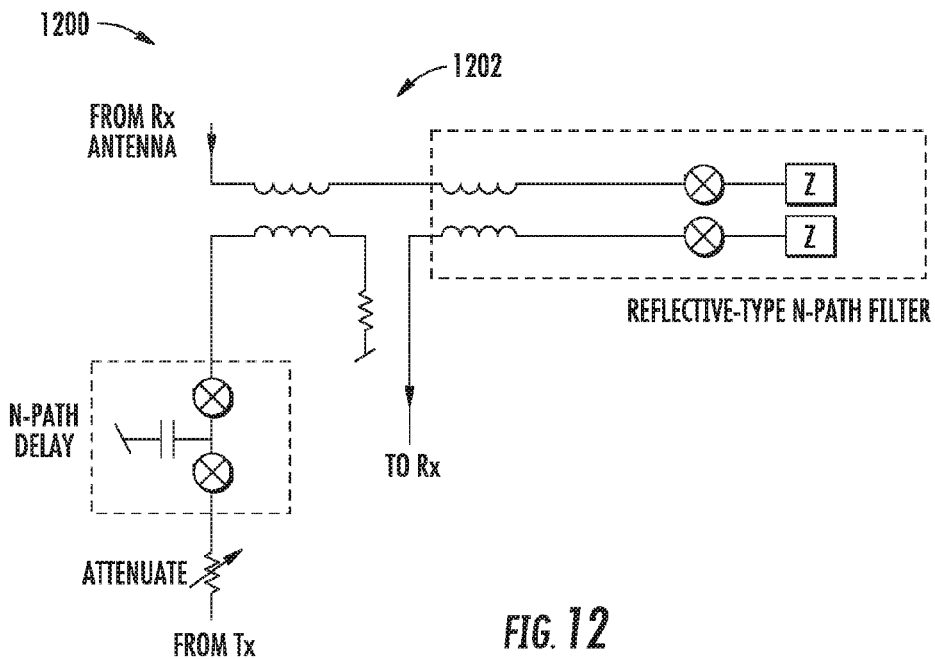
FIG. 12 is a block diagram of an example duplexer implemented using transformers.
Figure 13:
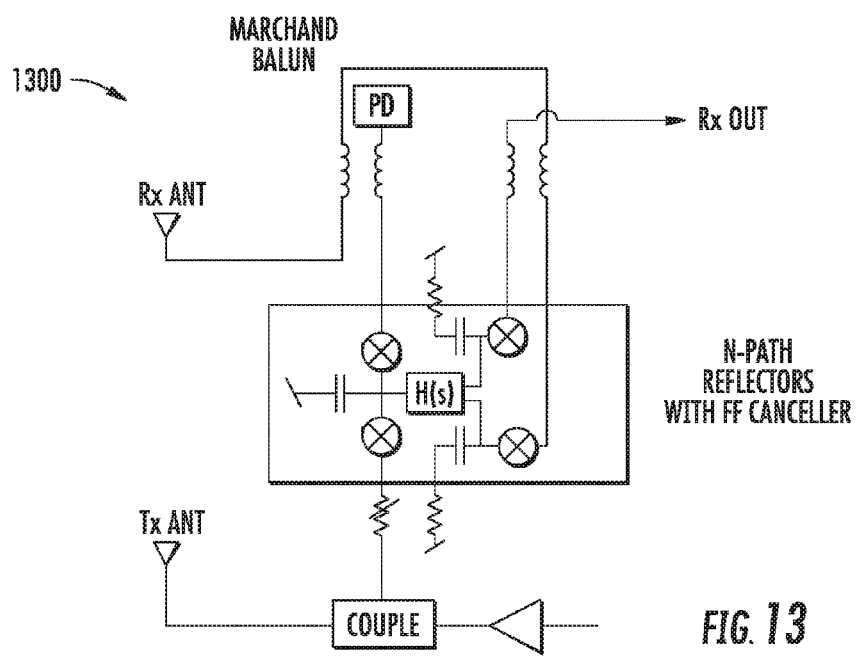
FIG. 13 is a block diagram of an example duplexer having two feedforward paths and a transformer.

FIG. 9 is a block diagram of an example duplexer 900 having one feedforward path 902 to cancel leakage across the coupler of the reflective-type tunable filter. FIG. 10 is a block diagram of an example duplexer 1000 having a Marchand balun 1002, and including passive mixers. FIG. 11 is a block diagram of an example duplexer 1100 having a Marchand balun 1102. FIG. 12 is a block diagram of an example duplexer 1200 implemented using transformers 1202. FIG. 13 is a block diagram of an example duplexer 1300 having two feedforward paths, transformers, and a Marchand balun.

Accordingly, while the methods, systems, and computer readable media have been described herein in reference to specific embodiments, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Various combinations and sub-combinations of the structures and features described herein are contemplated and will be apparent to a skilled person having knowledge of this disclosure. Any of the various features and elements as disclosed herein may be combined with one or more other disclosed features and elements unless indicated to the contrary herein.

Correspondingly, the subject matter as hereinafter claimed is intended to be broadly construed and interpreted, as including all such variations, modifications and alternative embodiments, within its scope and including equivalents of the claims. It is understood that various details of the presently disclosed subject matter may be changed without departing from the scope of the presently disclosed subject matter. Furthermore, the foregoing description is for the purpose of illustration only, and not for the purpose of limitation.

What is claimed is:

1. A tunable duplexer comprising:
one or more antennas;
an isolator electrically coupled to the one or more antennas for isolating a received signal and a transmitted signal on the one or more antennas;
a combiner comprising a first input electrically coupled to the one or more antennas; and
a feedforward path, between a coupler of the transmitted signal and a second input of the combiner, configured to cancel leakage across the isolator, wherein the feedforward path comprises a tunable delay cell comprising a plurality of passive mixers electrically coupled together for receiving an input signal and outputting a delayed signal, each passive mixer comprising a plurality of mixer switches.

2. The tunable duplexer of claim 1, wherein the tunable delay cell comprises a control circuit for providing, to each passive mixer, a respective plurality of local oscillator (LO) signals, one to each mixer switch of each passive mixer, and wherein the control circuit is configured to vary the LO signals to cause a target frequency band of the input signal to be delayed by a target delay time in propagating through the passive mixers.

3. The tunable duplexer of claim 1, wherein the feedforward path comprises a tunable attenuator.

4. The tunable duplexer of claim 1, comprising a reflective-type tunable filter electrically coupled to an output of the combiner.

5. The tunable duplexer of claim 4, comprising a second feedforward path, between the output of the combiner and one or more reflective loads of the reflective-type tunable filter, configured to cancel leakage over a directional coupler of the reflective-type tunable filter, wherein the second feedforward path is configured to cancel the leakage over the directional coupler by virtue of a down-converting mixer configured to downconvert a feedforward signal on the second feedforward path to baseband before the feedforward signal is coupled to one or more reflective loads of the reflective-type tunable filter.

6. The tunable duplexer of claim 5, comprising a third feedforward path, between the feedforward path and the one or more reflective loads of the reflective-type tunable filter, configured to further cancel leakage over the isolator.

7. A tunable duplexer comprising:
one or more antennas;
an isolator electrically coupled to the one or more antennas for isolating a received signal and a transmitted signal on the one or more antennas;
a combiner comprising a first input electrically coupled to the one or more antennas;
a reflective-type tunable filter electrically coupled to an output of the combiner; and
a feedforward path, between the output of the combiner and one or more reflective loads of the reflective-type tunable filter, configured to cancel leakage across a directional coupler of the reflective-type tunable filter, wherein the feedforward path is configured to cancel the leakage by virtue of one or more passive mixers in the feedforward path.

8. A tunable duplexer comprising:
one or more antennas;
an isolator electrically coupled to the one or more antennas for isolating a received signal and a transmitted signal on the one or more antennas;
a reflective-type tunable filter electrically coupled to the one or more antennas; and
a feedforward path, between a coupler of the transmitted signal and one or more reflective loads of the reflective-type tunable filter, configured to cancel leakage across the isolator.

* * * * *